(12) United States Patent
Bauer

(10) Patent No.: US 9,921,246 B2
(45) Date of Patent: Mar. 20, 2018

(54) CAPACITIVE ELECTRIC-FIELD SENSOR AND METHOD OF MAKING SAME

(71) Applicant: GREEN SEAS VENTURES, LTD, Tortola (VG)

(72) Inventor: Alberto Bauer, Tierra Verde, FL (US)

(73) Assignee: GREEN SEAS VENTURE, LTD, Tortola (VG)

( * ) Notice: Subject to any disclaimer, the term of this patent is extended or adjusted under 35 U.S.C. 154(b) by 83 days.

(21) Appl. No.: 15/021,044

(22) PCT Filed: Sep. 18, 2014

(86) PCT No.: PCT/IT2014/000251
§ 371 (c)(1),
(2) Date: Mar. 10, 2016

(87) PCT Pub. No.: WO2015/044972
PCT Pub. Date: Apr. 2, 2015

(65) Prior Publication Data
US 2016/0245845 A1    Aug. 25, 2016

(30) Foreign Application Priority Data

Sep. 30, 2013    (IT) .............................. BO2013A0535

(51) Int. Cl.
| | | |
|---|---|---|
| *G01R 15/16* | (2006.01) |
| *B29C 33/00* | (2006.01) |
| *B29C 39/00* | (2006.01) |
| *B29C 39/10* | (2006.01) |
| *B29C 39/26* | (2006.01) |
| *G01R 3/00* | (2006.01) |
| *G01R 27/26* | (2006.01) |
| *G01R 29/12* | (2006.01) |

(Continued)

(52) U.S. Cl.
CPC .......... *G01R 15/16* (2013.01); *B29C 33/0061* (2013.01); *B29C 39/003* (2013.01); *B29C 39/10* (2013.01); *B29C 39/26* (2013.01); *G01R 3/00* (2013.01); *G01R 15/165* (2013.01); *G01R 27/2605* (2013.01); *B29K 2063/00* (2013.01); *B29K 2067/00* (2013.01); *B29K 2995/0006* (2013.01); *B29K 2995/0007* (2013.01); *B29L 2031/3481* (2013.01); *G01R 29/12* (2013.01)

(58) Field of Classification Search
CPC .................................. G01R 15/16; G01R 3/00
See application file for complete search history.

(56) References Cited

U.S. PATENT DOCUMENTS 4,025,846 A  *  5/1977  Franz .................... G01F 23/268
                                                    324/671
4,311,959 A     1/1982  Riessland
(Continued)

Primary Examiner — Walter L Lindsay, Jr.
Assistant Examiner — Milton Gonzalez
(74) Attorney, Agent, or Firm — Andrew Wilford

(57) ABSTRACT

A capacitive sensor to sense an electric field has a shield tube that extends axially along its own axis and has a first open end, an electric field sensor positioned within the shield tube, a source electrode, and a mass of dielectric insulating material positioned within the shield tube and around the shield tube. The shield tube is formed by a jacket having a plurality of first through openings that each have an area comprised between a minimum of 0.1 mm$^2$ and a maximum of 3 mm$^2$.

14 Claims, 13 Drawing Sheets

(51) Int. Cl.
 *B29K 63/00* (2006.01)
 *B29K 67/00* (2006.01)
 *B29L 31/34* (2006.01)

(56) References Cited

U.S. PATENT DOCUMENTS

| | | |
|---|---|---|
| 4,551,785 A | 11/1985 | Kroner |
| 2009/0126984 A1 | 5/2009 | Saneto |
| 2011/0121820 A1* | 5/2011 | Handshoe .............. G01R 15/16 |
| | | 324/126 |
| 2011/0121842 A1* | 5/2011 | Bauer .................. G01R 15/165 |
| | | 324/686 |
| 2011/0205683 A1 | 8/2011 | Peretto |
| 2014/0145706 A1* | 5/2014 | Bauer ................ G01R 19/0046 |
| | | 324/72 |
| 2015/0145502 A1* | 5/2015 | Javora ...................... G01R 1/18 |
| | | 324/156 |

* cited by examiner

CAPACITIVE ELECTRIC-FIELD SENSOR AND METHOD OF MAKING SAME

CROSS REFERENCE TO RELATED APPLICATIONS

This application is the US-national stage of PCT application PCT/IT2014/000251 filed 18 Sep. 2014 and claiming the priority of Italian patent application BO2013A000535 itself filed 30 Sep. 2013.

FIELD OF THE INVENTION

The Present invention relates to a capacitive sensor for detecting an electric field, as well as a system and a method to obtain it.

More in particular, the present invention relates to a capacitive sensor to detect an electric field, in which said capacitive sensor comprises a shielding tubular body, an electric field sensor and a source electrode and a resin of dielectric insulating material, as well as a system and a method for obtaining said capacitive sensor.

BACKGROUND OF THE INVENTION

Currently, the capacitive sensors for detecting electrical fields, as well as systems and methods for obtaining them have a number of drawbacks.

A first drawback is due to the fact that the resin of dielectric material positioned into and around the shielding body includes vacuoles (air bubbles), with consequent phenomena of unwanted partial discharges.

A second drawback is due to the fact that the resin is detached with respect to the shielding body and/or with respect to the electric field sensor and/or with respect to other bodies that make up the capacitive sensor, with consequent phenomena of unwanted partial discharges.

A third drawback is due to the fact that the aforementioned resin not perfectly adhere and/or it does not perfectly cling and/or it is constrained with respect to the elements that make up the capacitive sensor and, therefore, as a result of aging, disjunctions occur between said resin and the above elements, in which said disjunctions cause unwanted partial discharges.

This drawback is particularly present when the capacitive sensor is used in an environment where the operating temperature (hot/cold) varies cyclically.

OBJECT OF THE INVENTION

The purpose of the present invention is to obviate the above drawbacks.

The invention solves the problem by providing a capacitive sensor to sense an electric field and that comprises:

a shielding tubular body that extends axially along its own axis and forms a first open end;

an electric field sensor positioned within said shielding tubular body;

a source electrode;

a mass of dielectric insulating material positioned within said shielding tubular body and around said shielding tubular body, wherein the shielding tubular body is formed by a mantle having a plurality of first through openings, and each of said first through openings has an area of between a minimum of 0.1 mm$^2$ and a maximum of 3 mm$^2$.

The invention also solves the problem of creating a system to obtain a capacitive sensor able to sense an electric field, the system comprising:

a shielding tubular body that extends axially along its own axis and a first end and a second end;

an electric field sensor positioned within said shielding tubular body;

a source electrode positioned outside the shielding tubular body and near said first open end, or a source electrode having a shank coaxially positioned inside the shielding tubular body;

a mass of dielectric insulating material within said shielding tubular body;

a mold comprising one or more pouring ducts;

wherein the shielding tubular body is formed by a mantle having a plurality of first through openings of an elongated shape that has a long dimension and a short dimension;

wherein the long dimension of each through openings is oriented parallel to the axis of the shielding tubular body;

wherein the mass of dielectric insulating material inside the shielding tubular body is a compound that can take a first liquid/pasty state and a second solid state, wherein the compound in its first liquid/pasty state is cast via the pouring ducts toward and against the outside of the mantle of the shielding tubular body.

The invention also solves the problem of providing a method to obtain a capacitive sensor to sense an electric field, the sensor comprising:

a shielding tubular body that extends axially along its own axis and is formed with a first end and a second end;

an electric field sensor inside the shielding tubular body;

a source electrode outside the shielding tubular body and near said first open end, or a source electrode having a shank coaxially inside the shielding tubular body;

a mass of dielectric insulating material positioned within said shielding tubular body;

wherein the shielding tubular body is formed by a mantle having a plurality of first through openings;

wherein said plurality of first through openings have an elongated shape with a long dimension and a short dimension;

wherein the long dimension of each through opening is parallel to the axis of the shielding tubular body;

wherein the mass of dielectric insulating material disposed within the shielding tubular body is a compound that can take a first liquid/pasty state and a second solid state, and wherein said method is characterized in that it comprises an operative step wherein said compound in its first liquid/pasty state flows/passes through said plurality of first through openings inside the shielding tubular body in order to form the mass of insulating material within the shielding tubular body.

By the capacitive sensor of the present invention, as well as by the related system and method to obtain it, the obtained capacitive sensor having excellent characteristics with respect to the shield with respect to the surrounding electrical fields and it is obtained, in addition, a capacitive sensor without vacuoles and without any disjunctions it is obtained.

BRIEF DESCRIPTION OF THE DRAWINGS

Further characteristics and advantages of the present invention will be particularly evident from the following description of some preferred embodiments, here provided by way of non-limiting example and makes reference to the appended drawings, in which.

BEST MODE OF CARRYING OUT THE INVENTION

Figure 1:
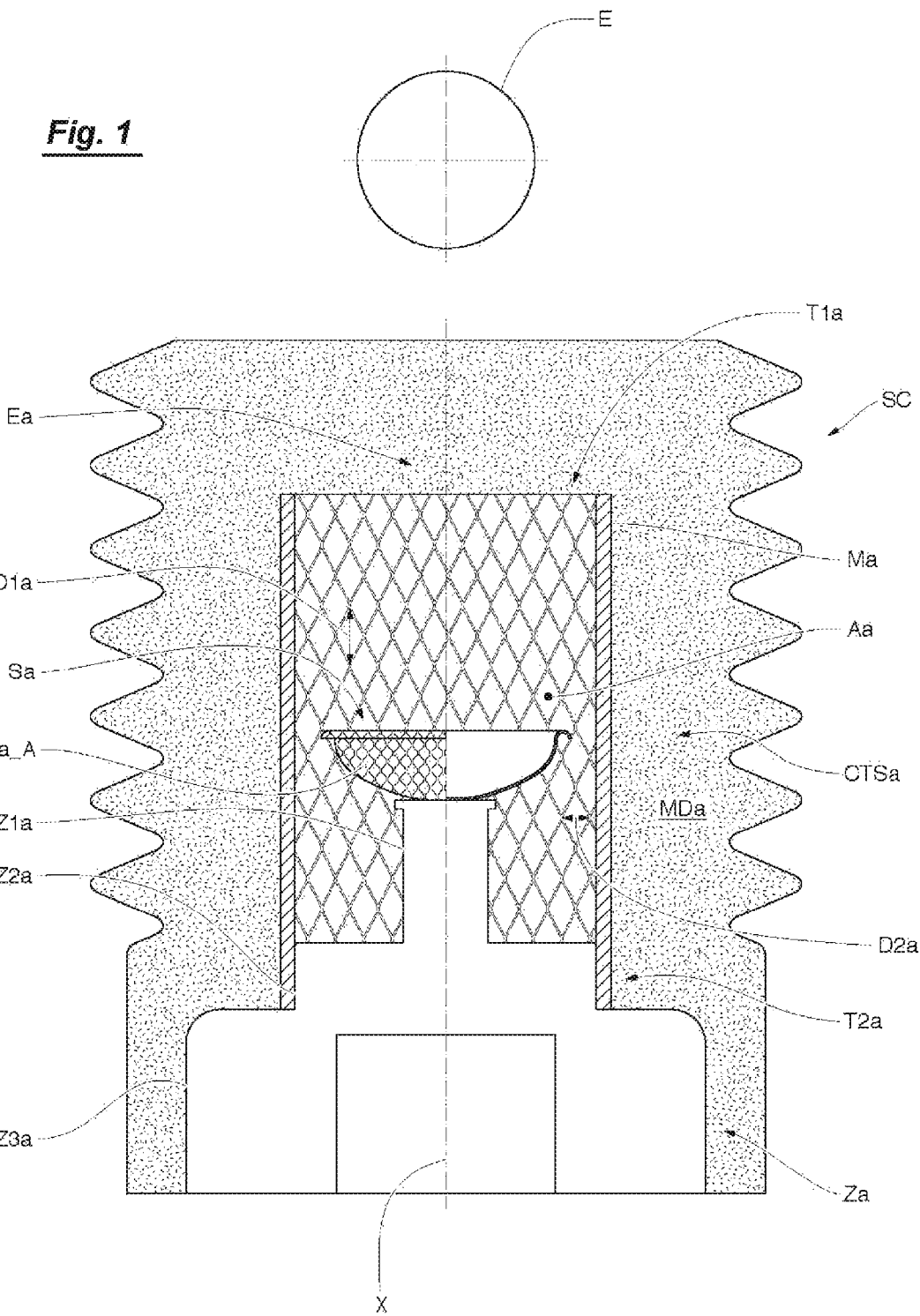
FIG. 1 illustrates a first embodiment of a capacitive sensor of the present invention.
Figure 1A:
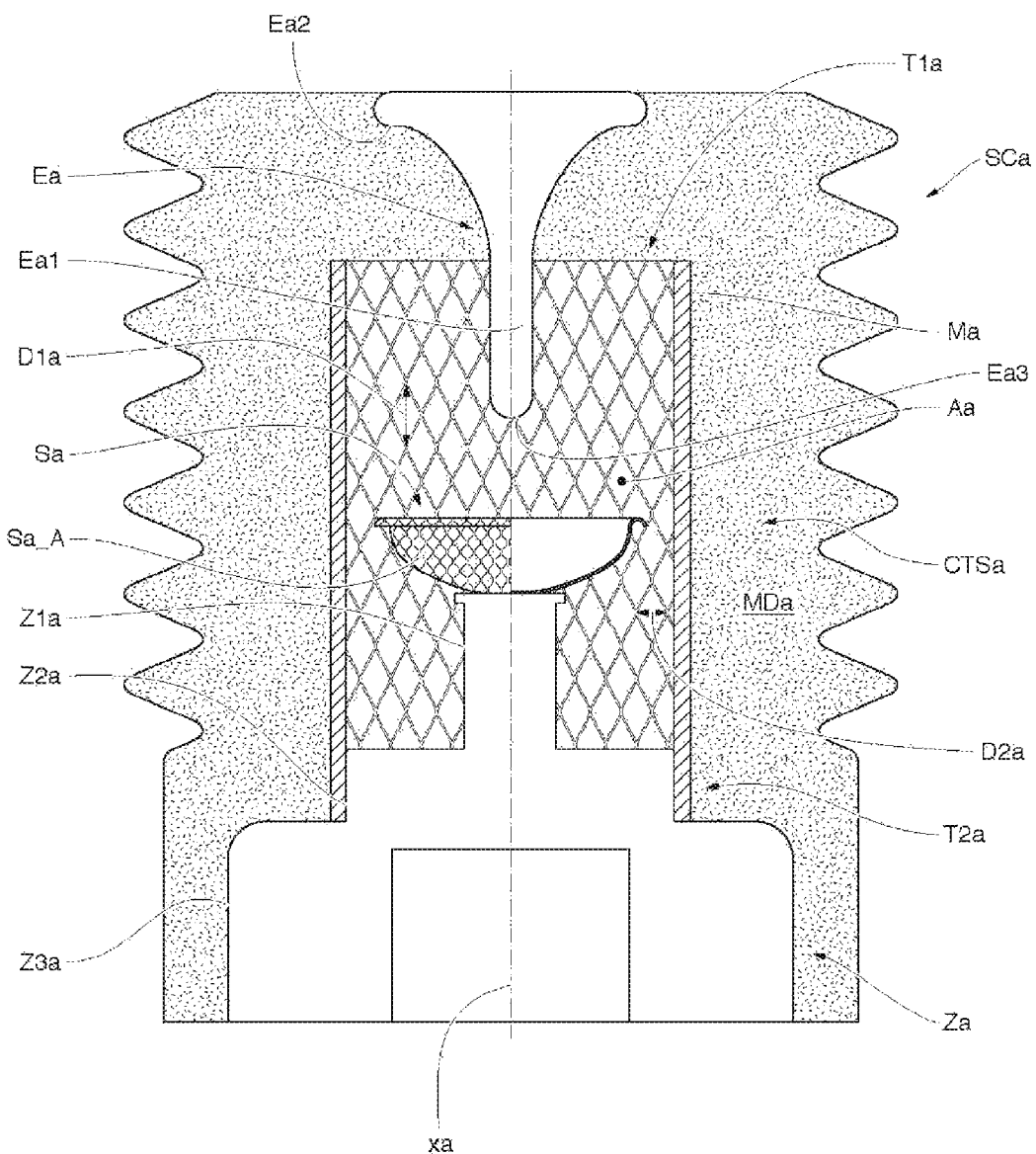
FIG. 1A illustrates a second embodiment of a capacitive sensor of the present invention.
Figure 1B:
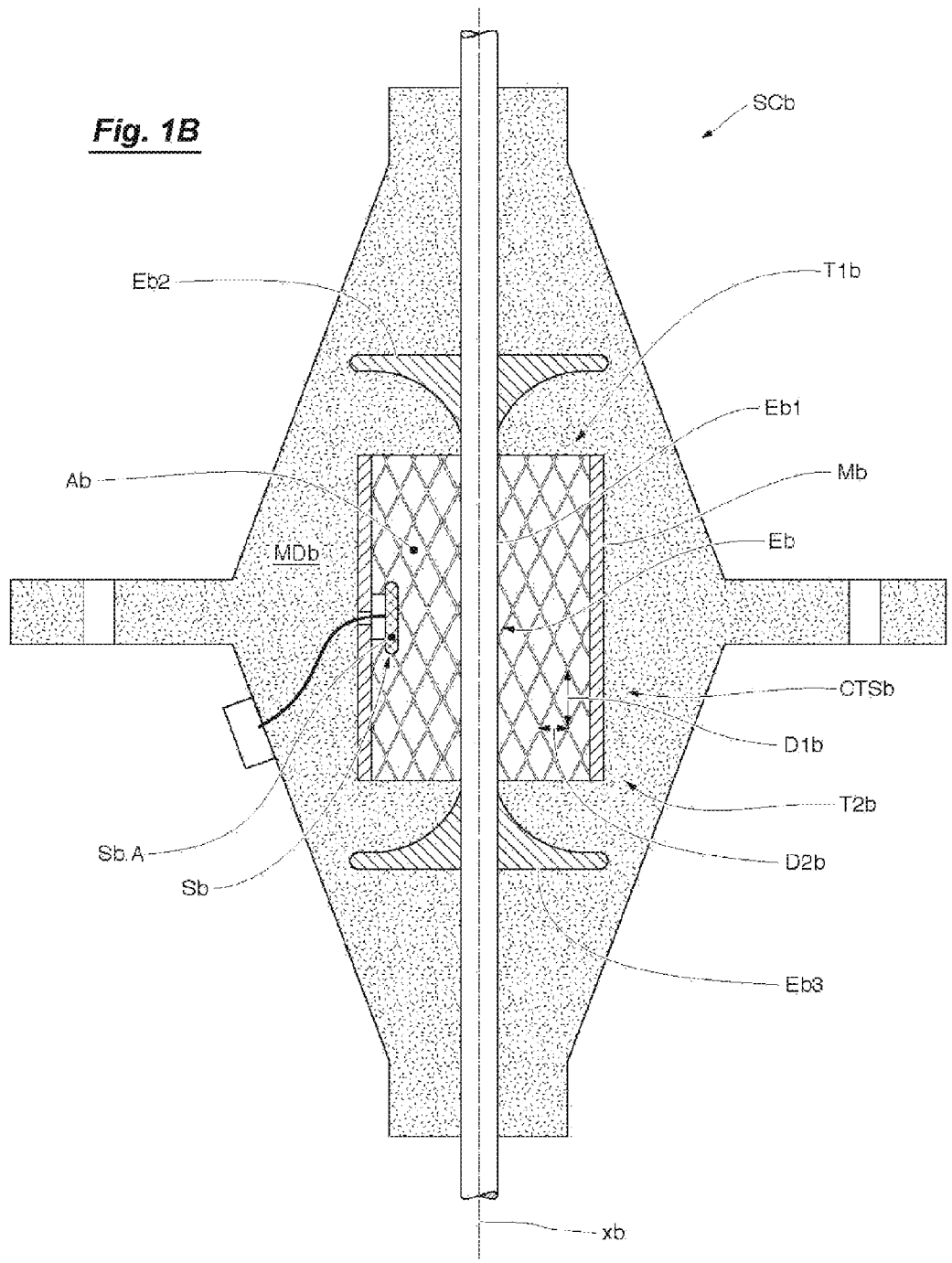
FIG. 1B illustrates a third embodiment of a capacitive sensor of the present invention.

Capacitive Sensor FIG. 1, FIG. 1A and FIG. 1B

FIG. 1 shows a first embodiment of a capacitive sensor indicated by the reference SC, in which said capacitive sensor comprises:

a shielding tubular body CTSa that extends axially along its own axis X and that forms a first open end T1a;

an electric field sensor Sa positioned within said shielding tubular body CTSa;

a source electrode E positioned in the proximity of said first open end T1a;

a mass of dielectric insulating material MDa, positioned inside and around said shielding tubular body, CTSa so as to form a supporting structure.

The shielding tubular body CTSa is formed by a mantle Ma having a plurality of first through openings Aa that each have an area between a minimum of 0.1 mm² and a maximum of 3 mm².

Each first through opening Aa has an elongated shape that has a greater dimension D1a and a smaller dimension D2a, the greater dimension D1a being oriented parallel to the axis X of the shielding tubular body CTSa.

The mantle Ma of said shielding tubular body CTSa has a thickness comprised between a minimum of 0.05 mm and a maximum of 1 mm.

The electric field sensor Sa is positioned within said shielding tubular body CTSa and is positioned in such way to form a capacitive coupling with the source electrode E.

Furthermore, preferably, the electric field sensor Sa comprises a plurality of second through openings SaA.

The source electrode E, in the specific embodiment of FIG. 1, is positioned externally and spaced with respect to the shielding tubular body CTSa, positioned near the first open end T1a and, more particularly, it is positioned axially spaced with respect to the first open end T1a of said shielding tubular body CTSa.

FIGS. 1A and 1B illustrate, schematically, respectively, a second and a third embodiment of a capacitive sensor, both objects of the present invention, where the two embodiments are indicated with the references SCa and SCb respectively.

In the following description, the references that have the postscript letter "a" refer to FIG. 1A and the references that have the postscript letter "b" refer to FIG. 1B.

With reference to said FIGS. 1A and 1B, the capacitive sensor, Sca/SCb comprises:

a shielding tubular body CTSa/CTSb that extends axially along a longitudinal axis Xa/Xb, a first open end T1a/T1b, and a second open end T2a/T2b;

an electric field sensor, Sa/Sb, positioned within said shielding tubular body CTSa/CTSb;

a voltage source electrode Ea/Eb having a stem, Ea1/Eb1 that extends along the axis Xa/Xb within said shielding tubular body CTSa/CTSb;

a mass of dielectric material Mda/MDb inside the shielding tubular body CTSa/CTSb, as well as around said elements.

The shielding tubular body CTSa/CTSb is formed by a mantle Ma/Mb having a plurality of first through-openings, Aa/Ab each having an elongated shape of a greater dimension D1a/D1b and a minor dimension D2a/D2b, the greater dimension D1a/D1b of each first through-opening Aa/Ab, being oriented parallel to the axis Xa/Xb of the shielding tubular body CTSa/CTSb.

Preferably, each first through opening Aa/Ab has an area between a minimum of 0.1 mm² and a maximum of 3 mm², and the mantle Ma/Mb of said shielding tubular body CTSa/CTSb has a thickness comprised between a minimum of 0.05 mm and a maximum of 1 mm.

The electric field sensor Sa/Sb is disposed within said shielding tubular body CTSa/CTSb, and said electric field sensor Sa/Sb is positioned in such a way as to form a capacitive coupling with said source electrode Ea/Eb.

The electric field sensor Sa, Sb preferably has a plurality of second through openings SaA, SbA.

With particular reference to the second embodiment illustrated in FIG. 1A, the capacitive sensor SCa comprises a shielding tubular body CTSa, an electric field sensor Sa, a voltage-source electrode Ea, a base Za, and a mass of dielectric material Ma formed, for example, by a resin dielectric material, positioned inside the shielding tubular body and outside the shielding tubular body.

The shielding tubular body CTSa extends axially along a longitudinal axis Xa and has a first open end T1a and a second closed head T2a.

The electric field sensor Sa is positioned within said shielding tubular body CTSa by the base Za, and is positioned in such a way as to form a capacitive coupling with the source electrode Ea.

Furthermore, preferably, said electric field sensor Sa is shaped like a cup and/or a spherical cap with an opening facing the electrode Ea and is preferably formed by a mantle having a plurality of second through openings SaA.

The source electrode Ea is positioned near to the first end T1a of the shielding tubular body CTSa and, preferably, said source electrode Ea has a shape like a funnel (trumpet) with rounded sides and, substantially, is formed by a stem Ea1 having an axis coaxial to the axis of said shielding tubular body CTSa, an optional head Ea2 positioned near said first open end T1a and outside with respect to the shielding tubular body CTSa, and a free rounded end Ea3 extending toward the second end T2a, this end Ea3 being axially spaced from the electric field sensor Sa.

The base Za is positioned near the second end T2a of the shielding tubular body CTSa and, preferably, has the shape of a cylindrical pyramid, and is formed by a plurality of coaxial cylinders having different diameters.

Said base Za comprises a first cylinder Z1a that supports in position the electric field sensor Sa, a second cylinder Z2a mechanically coupled with the second end T2a of the shielding tubular body CTSa, and a third cylinder, Z1a positioned outside the shielding tubular body CTSa.

Said shielding tubular body CTSa is formed by a mantle Ma comprising a plurality of first through openings Aa that each have an elongated shape with a greater dimension D1a and a smaller dimension D2b, the greater dimension D1a being oriented parallel to the axis Xa of the shielding tubular body CTSa.

Preferably, each first through opening Aa has an area between a minimum of 0.1 $mm^2$ and a maximum of 3 $mm^2$, and the mantle Ma of said shielding tubular body CTSa has a thickness comprised between a minimum of 0.05 mm and a maximum of 1 mm.

The shielding tubular body CTSa having the first openings Aa, as better described below, can be formed by a expanded metal sheet, or by perforated metal sheet, or by a mesh/grid/cloth formed by a plurality of wires.

With particular reference to the third embodiment illustrated in FIG. 1B, the capacitive sensor SCb comprises a shielding tubular body CTSb, an electric field sensor Sb, a live source electrode Eb having a stem E1b extending within said shielding tubular body CTSb, and a mass of dielectric material MDb formed, for example, by a resin of dielectric material positioned inside the tubular body and outside of the shielding tubular body CTSb.

Said electric field sensor Sb is radially spaced from the stem Eb1 in order to form a capacitive coupling between them and, preferably, said electric field sensor Sb has a shape in the form of foil having a plurality of second through openings SbA.

The electrode source Eb includes said shank Eb1, a first optional head Eb2, and a second optional head Eb3.

Said first open end Eb2 is positioned externally of the shielding tubular body CTSb and, more particularly, it is positioned near and spaced from the axial end of the first head T1b.

Said stem Eb1 has an axis Xb extending axially within said shielding tubular body CTSb.

Said second open end Eb3 is positioned externally with respect to the shielding tubular body CTSb and, more particularly, it is positioned near and spaced with from the ends of the second head T2b.

How already provided in the first embodiment of FIG. 1A, said shielding tubular body CTSb is formed by a mantle Mb comprising a plurality of first through openings Ab that each have an elongated shape of a greater dimension D1b and a smaller dimension D2b, the greater dimension D1b being oriented parallel to the axis Xb of the shielding tubular body CTSb.

Still as provided in the first embodiment of FIG. 1A, preferably, each through opening Ab has an area between a minimum of 0.1 $mm^2$ and a maximum of 3 $mm^2$, and the mantle Mb of said shielding tubular body CTSb has a thickness comprised between a minimum of 0.05 mm and a maximum of 1 mm.

As provided in the first embodiment of FIG. 1A, preferably, the shielding tubular body CTSb with openings Ab, as more detailed below, can be made from an expanded metal sheet, or by a perforated metal sheet, or by a mesh/grid/cloth composed by a plurality of wires.

Sheet with First Openings (Expanded or Perforated)

Figure 2:
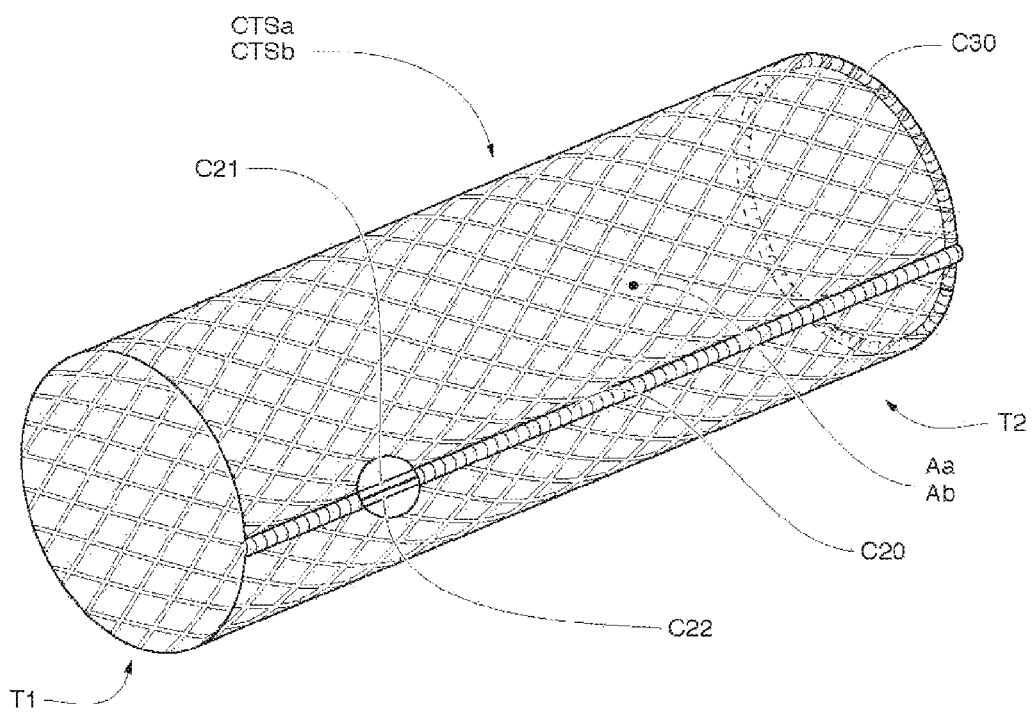
FIG. 2 illustrates a shielding tubular body formed by a sheet.

FIG. 2 illustrates a shielding tubular body, CTSa, CTSb, of the type described above with reference to FIGS. 1, 1A et 1B, made from a sheet of expanded metal network (microexpanded) or from a perforated metal sheet, in both cases, comprising the first openings Aa/Ab.

More particularly said shielding tubular body CTSa, CTSb, can be formed from a metal sheet having first openings Aa/Ab, folded in the manner of a tube, and comprising a first weld bead C20 extending axially and able to join together two axial edges C21 and C22 of the tubular folded sheet.

Preferably, said shielding tubular body, CTSa, CTSb, also comprises at least a second bead C30 of weld material, disposed around at least a head T2 of said shielding tubular body, CTSa, CTSb.

Figure 3:
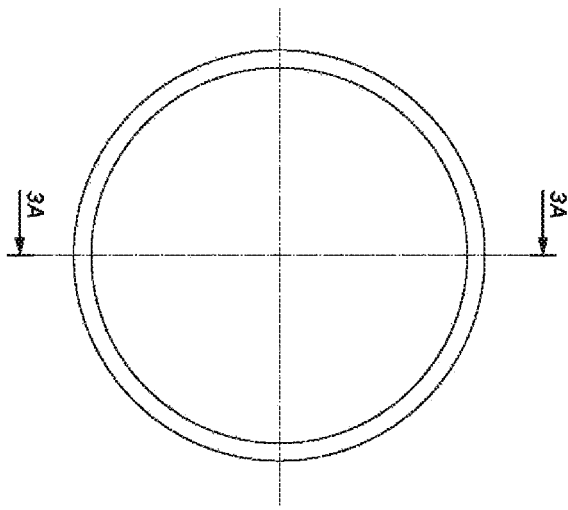
FIGS. 3 and 3A illustrate a shielding tubular body formed by a sheet with first rhombic openings, FIG. 3A being a section taken along line 3A 3A of FIG. 3.
Figure 3A:
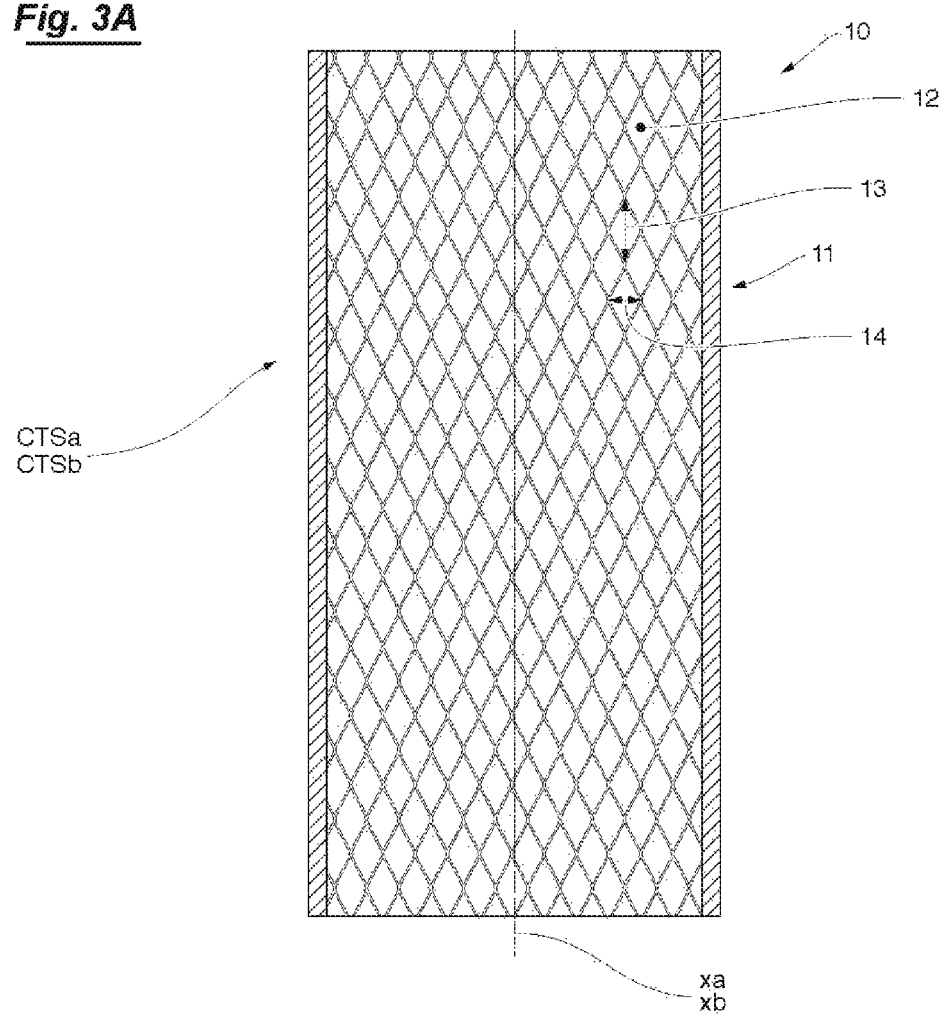

FIGS. 3 and 3A illustrate a first preferred embodiment of a shielding tubular body 10 made from an expanded metal sheet or perforated metal sheet of the above type.

Said shielding tubular body 10 is formed by a mantle 11 having a plurality of first rhombic through openings 12 having a major axis 13 and a minor axis 14, in which the major axis 13 of each rhombus is parallel to the axis Xa/Xb, of the shielding tubular body 10.

Figure 4:
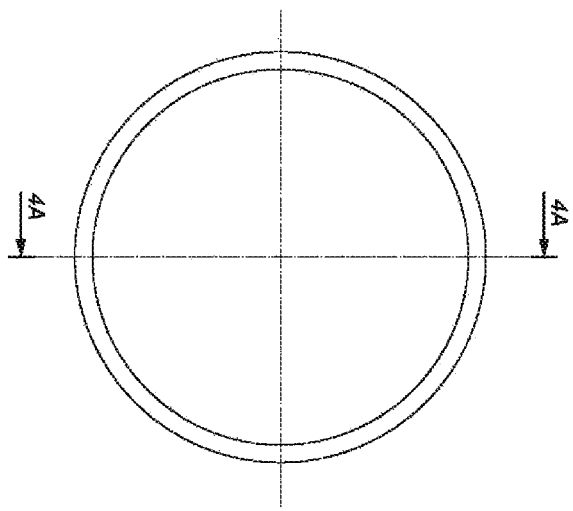
FIGS. 4 and 4A illustrate a shielding tubular body formed by a sheet with first elliptical openings, FIG. 4A being a section taken along line 4A 4A of FIG. 4.
Figure 4A:
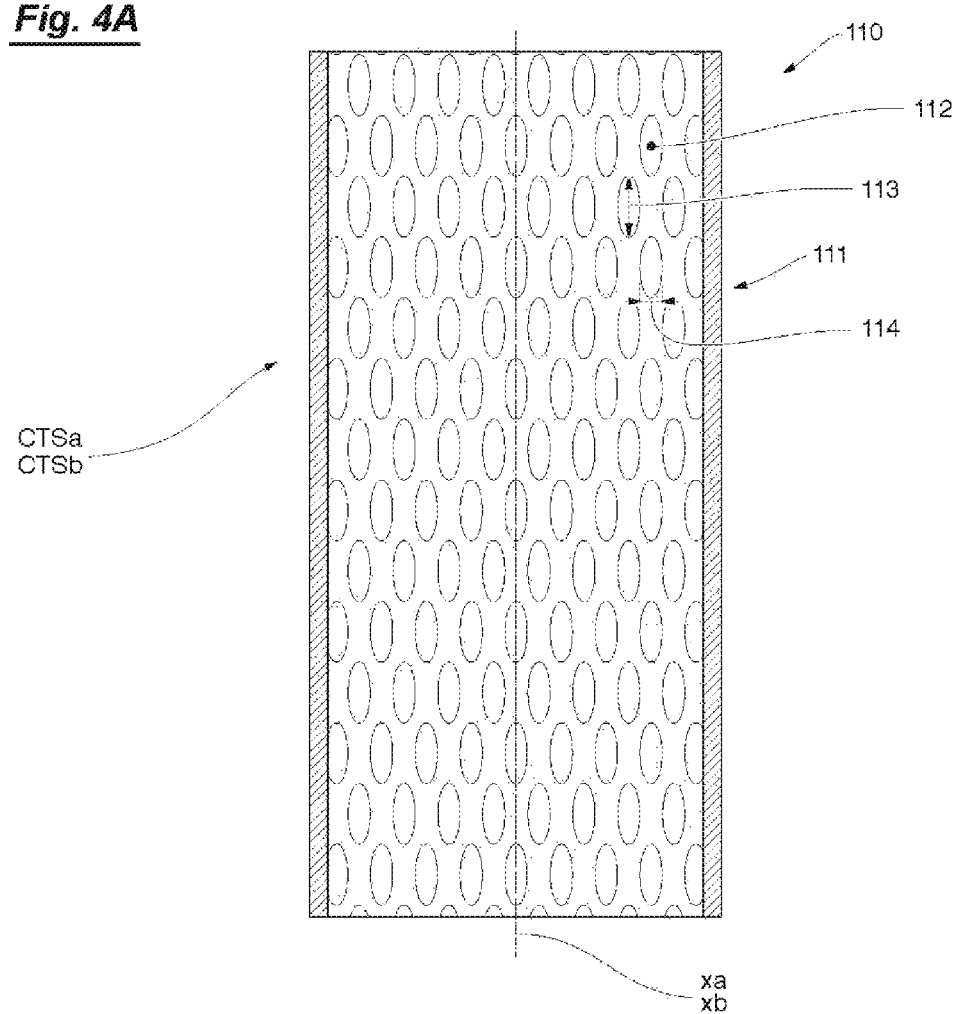

FIGS. 4 and 4A illustrate a second preferred embodiment of the shielding tubular body 110 made from an expanded metal sheet or perforated metal sheet of the above type.

Said shielding tubular body 110 is made from a mantle 111 having a plurality of first through openings 112 each shaped in the form of an ellipse having a major axis 113 and a minor axis 114, the major axis 113 of each ellipse being parallel to the axis Xa/Xb of the shielding tubular body 110.

Figure 5:
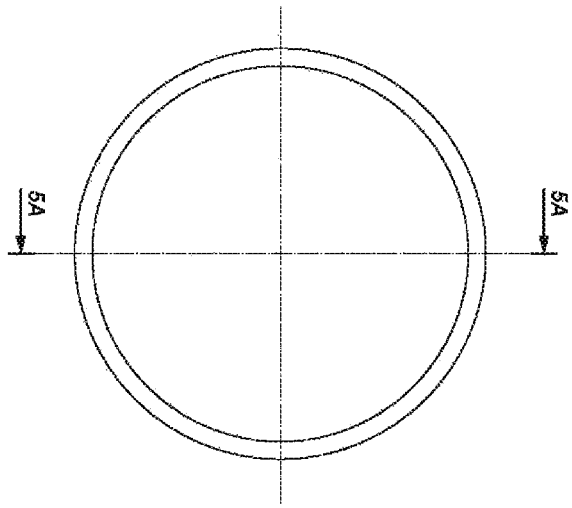
FIGS. 5 and 5A illustrate a shielding tubular body formed by a sheet with first openings shaped as rectangular slots, FIG. 5A being a section taken along line 5A 5A of FIG. 5.
Figure 5A:
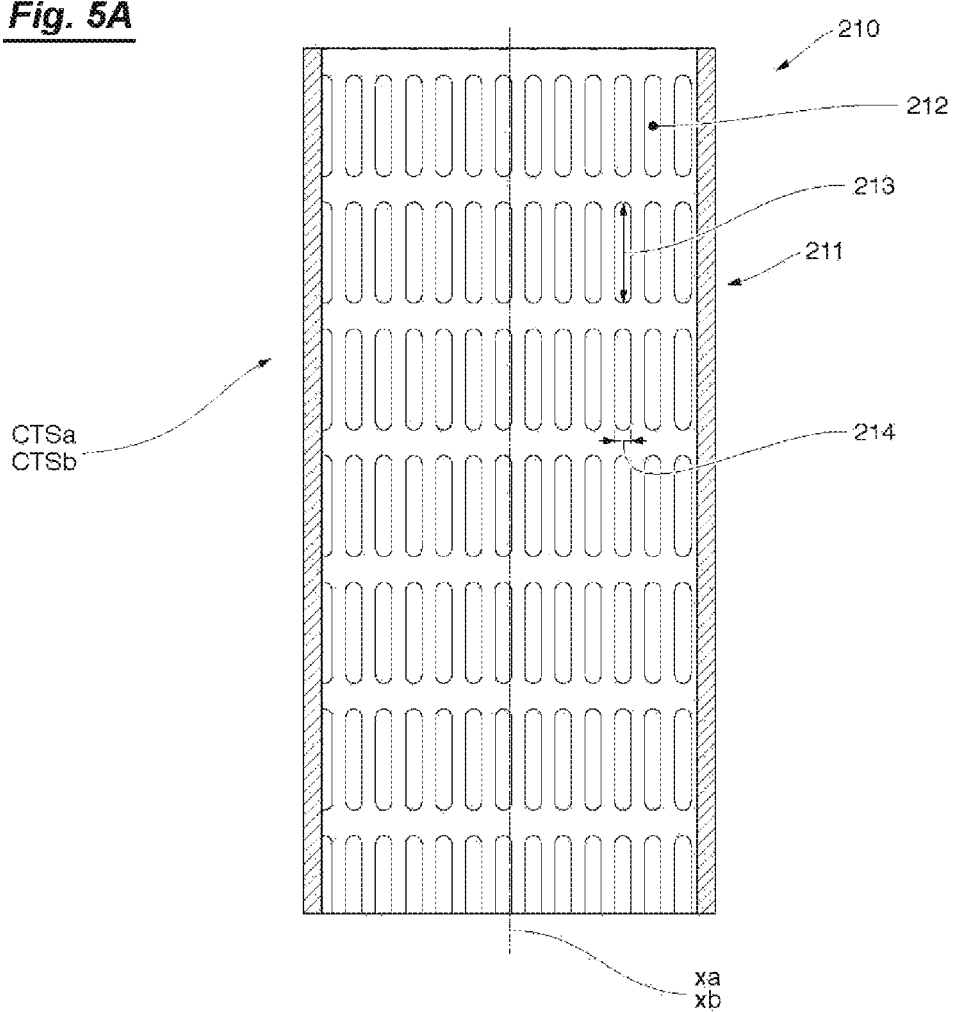

FIGS. 5 and 5A illustrate a third preferred embodiment of the shielding tubular body 210 made from an expanded metal sheet or a perforated metal sheet of the above type.

Said shielding tubular body 210 is formed by a mantle 211 comprising a plurality of first through openings 212 shaped oblong slots each with a major axis 213 and a minor axis 214, the major axis 213 of each oblong slot being parallel to the axis Xa/Xb of the shielding tubular body 210.

Figure 6:
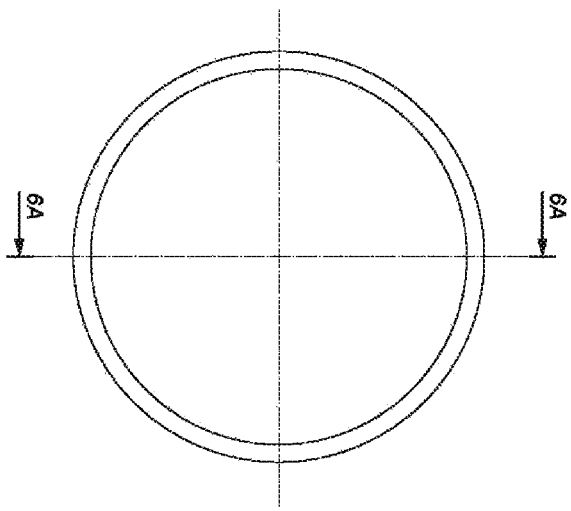
FIGS. 6 and 6A illustrate a shielding tubular body formed of sheet with first hexagonal openings, the FIG. 6A being a section taken along line 6A 6A of FIG. 6.
Figure 6A:
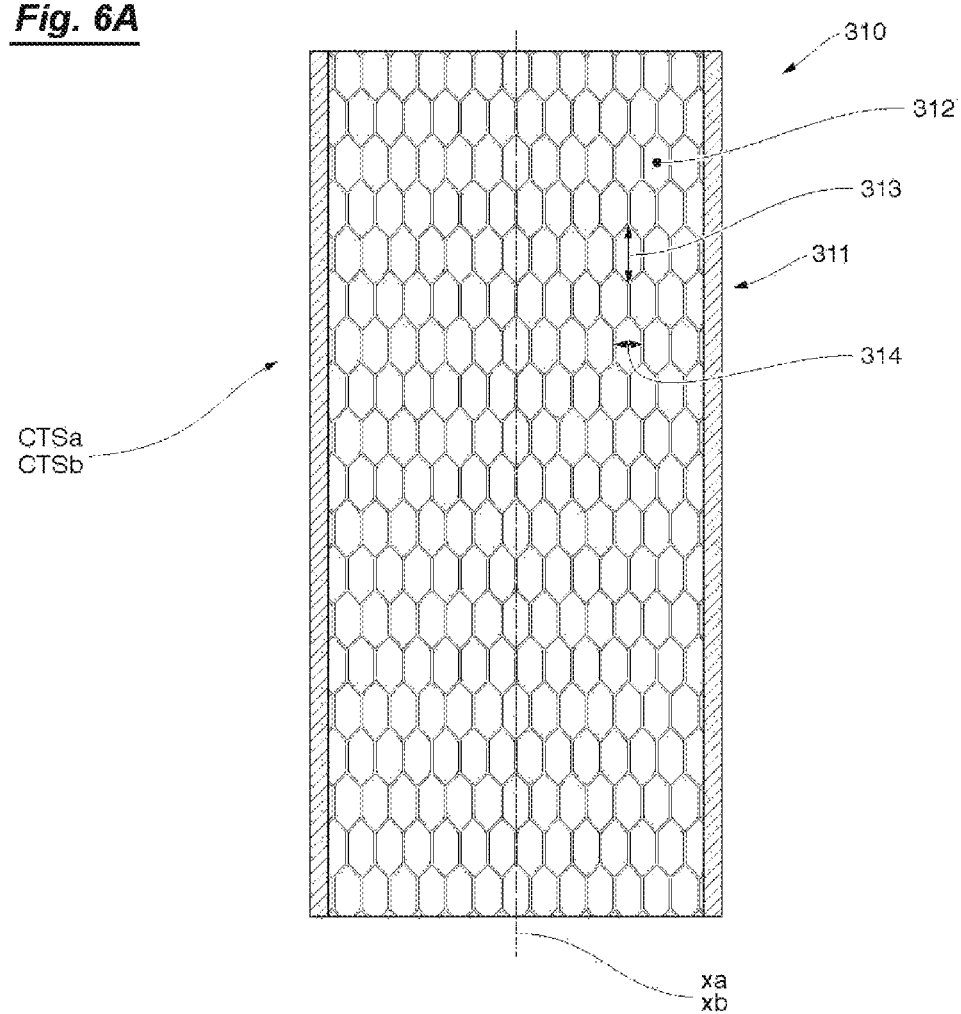

FIGS. 6 e 6A illustrate a fourth preferred embodiment of the shielding tubular body 310 made from a network of an expanded metal sheet or perforated metal sheet of the above type.

Said shielding tubular body 310 is formed by a mantle 311 comprising a plurality of first through openings 312 that are shaped in the form of an elongated hexagon, each with a major axis 313 and a minor axis 314, the major axes 313 of each elongated hexagon being parallel to the axis, Xa/Xb, of the shielding tubular body 310.

Mesh or Cloths with First Openings

With reference to FIGS. 1 and 1A, said shielding tubular body, CTSa/CTSb, is made from a mesh or grid or cloth that comprises wires of conductor material that intersect and/or are intertwined with each other such that the mesh or grid or cloth forms the plurality of first openings, Aa/Ab.

Preferably, each first opening, Aa/Ab, has an area between a minimum of 0.3 $mm^2$ and a maximum of 1.5 $mm^2$.

Figure 7:
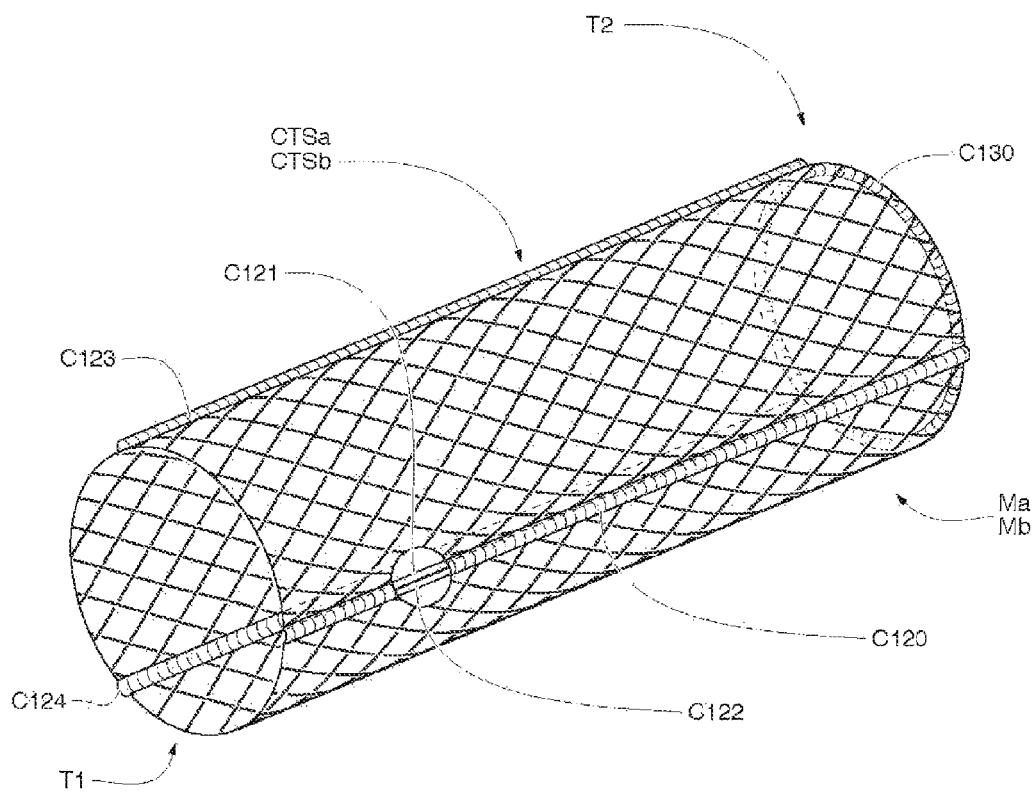
FIG. 7 illustrates a shielding tubular body formed by mesh or grid or cloth of wires.

FIG. 7 illustrates a shielding tubular body, CTSa, CTSb, of the type described above with reference to FIGS. 1, 1A and 1B, here formed by a sheet of mesh or grid or cloth made from metal wires.

Said shielding tubular body, CTSa/CTSb, comprises a first weld bead C120 extending axially along the mantle and able to join together the two axial opposite edges C121, C122, of a sheet of mesh or grid or cloth formed into a tube.

Preferably, said shielding tubular body, CTSa/CTSb, comprises one or more second axial beads C123, C124, of weld material, positioned on the mantle Ma, Mb and acting as reinforcement for the structure of the shielding tubular body.

Preferably, said shielding tubular body CTSa/CTSb comprises at least one third bead C130 of weld material, positioned around at least a head T2 of the shielding tubular body CTSa/CTSb.

Said first bead C120 and/or said one or more second beads C123, C124 and/or said third bead C130, are preferably made from a tin alloy.

Figure 8:
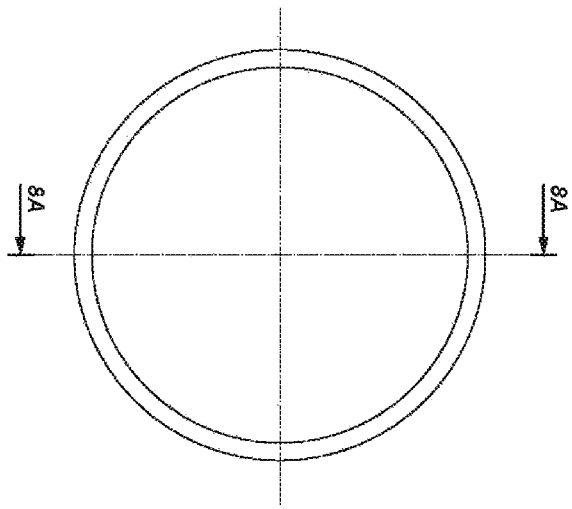
FIGS. 8 and 8A illustrate a shielding tubular body formed by cloth of net having first rhombic openings, FIG. 8A being a section taken along line 8A 8A of FIG. 8.
Figure 8A:
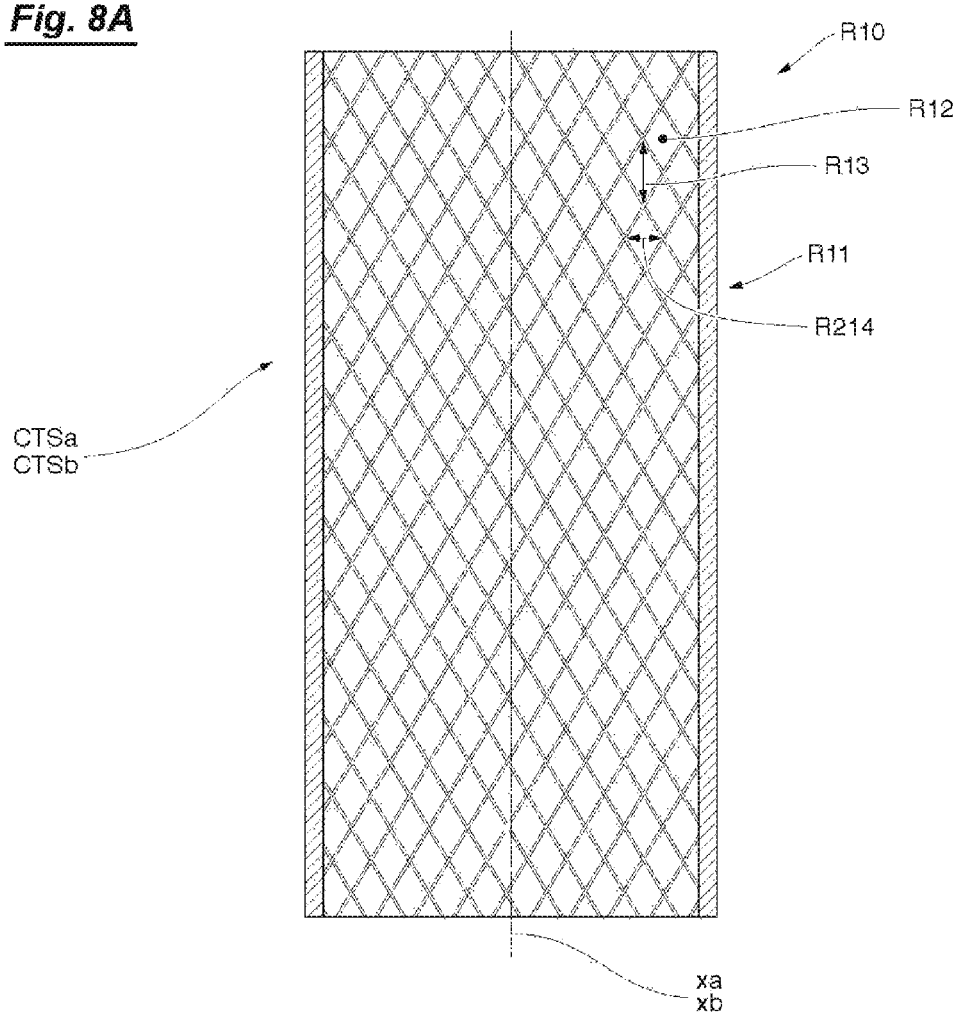

FIGS. 8 and 8A illustrate a first preferred embodiment of a shielding tubular body R10 made from a mesh or grid or cloth comprising metal wires.

Said shielding tubular body R10 is formed by a mantle R11 having a plurality of first openings R12 shaped like a rhombus, where each rhombus has a long diagonal R13 and a short diagonal R14, in which the long diagonals R13 of each rhombus are oriented parallel to the longitudinal axis, Xa/Xb, of the shielding tubular body.

Figure 9:
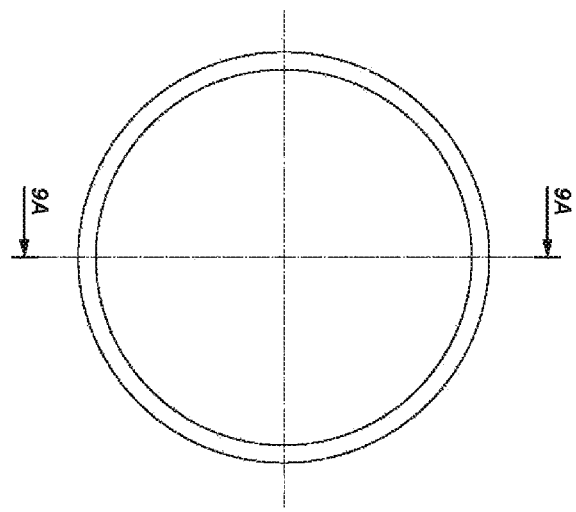
FIGS. 9 and 9A illustrate a shielding tubular body formed cloth of net having first rectangular openings, FIG. 9A being a section taken along line 9A 9A of FIG. 9.
Figure 9A:
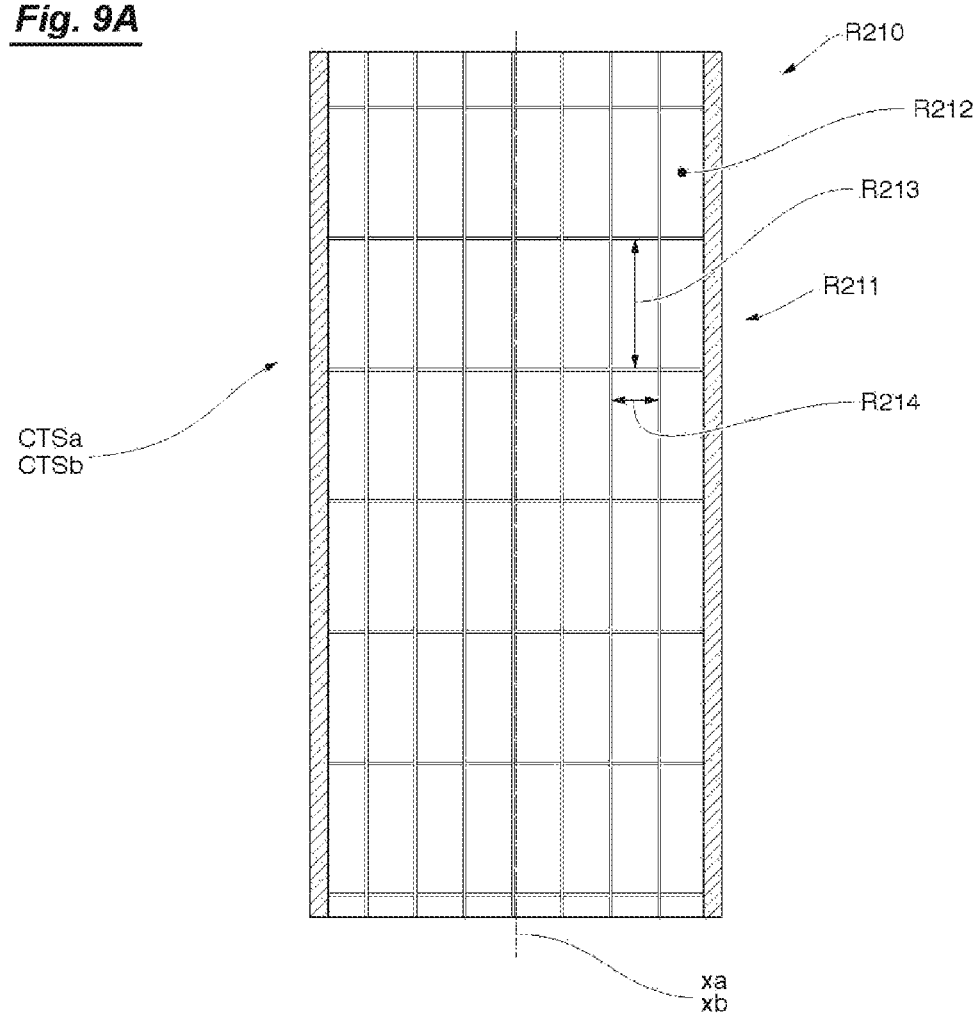

FIGS. 9 and 9A illustrate a second preferred embodiment of a shielding tubular body R210 made from a mesh or grid or cloth comprising metal wires.

Said shielding tubular body R210 is formed by a mantle R211 having a plurality of first openings R212 each shaped like a rectangle having a longer side R213 and a shorter side R214, the longer sides of each rectangle being parallel to the longitudinal axis Xa/Xb of the shielding tubular body.

The embodiments of the shielding tubular body made from a mesh or grid or cloth comprising metal wires of circular cross section and, preferably, said circular cross section has a diameter comprised between a minimum of 0.01 mm and a maximum of 1 mm.

Said wires of the mesh or grid or cloth may also have an elliptical cross section preferably having an area comprised between a minimum of 0.01 mm$^2$ and a maximum of 0.8 mm$^2$, or, a square cross section having an area comprised between a minimum of 0.001 mm$^2$ and a maximum of 0.8 mm$^2$, or a hexagonal cross section having an area comprised between a minimum of 0.01 mm$^2$ and a maximum of 0.8 mm$^2$.

Figure 10:
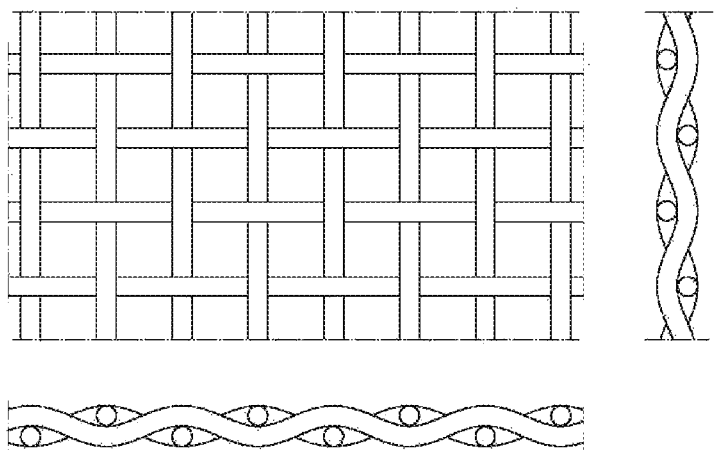
FIG. 10 shows an example of a mesh having crimped wires that are intertwined with each other.

With reference to FIG. 10, the mesh or grid or cloth above mentioned used to obtain the shielding tubular body may be formed by crimped wires intertwined with each other.

FIG. 10, by way of not limiting example, shows how said mesh or grid or cloth can comprise a first set of wires and a second set of wires, the first set of wires intersecting the second set of wires and thereby forming a grid in turn forming the above first openings, the first set of wires and said second set of wires forming points of intersection/contact that define segments of wires where said point of intersection/contact the respective first wires and the respective second wires are free to move with respect to each other (as flexure) with limited freedom of movement, as for example up to a maximum displacement of about 0.5 mm.

With reference to this embodiment, during the hot casting of the resin in the liquid state and during the cooling of the resin, with relative thermo-expansion and thermo-shrinking, the wires of the mesh or grid or cloth adhere to the resin.

Figure 11:
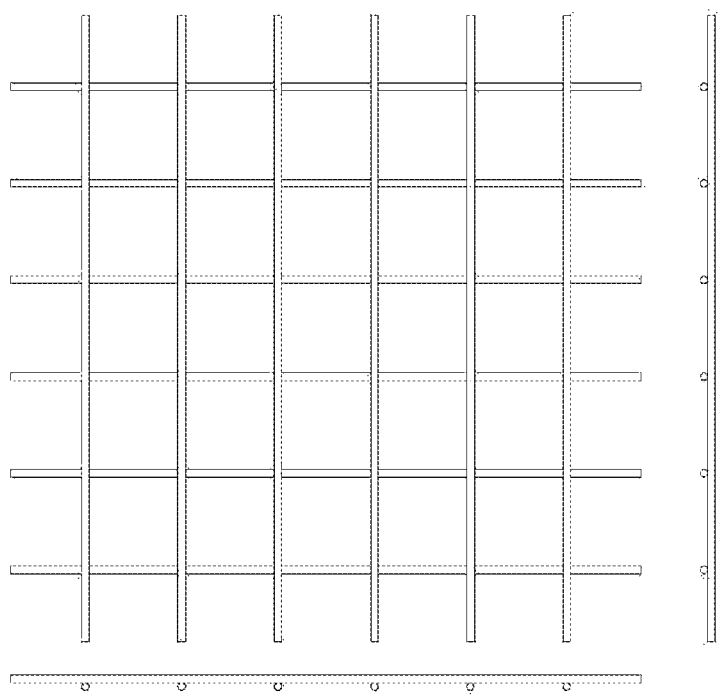
FIG. 11 illustrates an example of a wire mesh having wires electrowelded together.

FIG. 11 shows how the sheet of the mesh or grid or cloth described above used to form the shielding tubular body may comprise electrowelded wires that intersect each other.

Electric Field Sensor

FIGS. 1 and 1A illustrate how the capacitive sensor Sa preferably has a shape in the form of a cup and/or spherical cap with the opening facing the electrode Ea and formed by a mantle having a plurality of second through openings SaA preferably having the same dimensions as the openings Aa and Ab of the shielding tubular body CTSa, CTSb.

FIG. 1B shows that the capacitive sensor Sb preferably is a foil and includes a plurality of second through openings SbA that preferably have the same dimensions of the openings Aa and Ab of the shielding tubular body CTSa, CTSb.

System for Making a Capacitive Sensor

Figure 12:
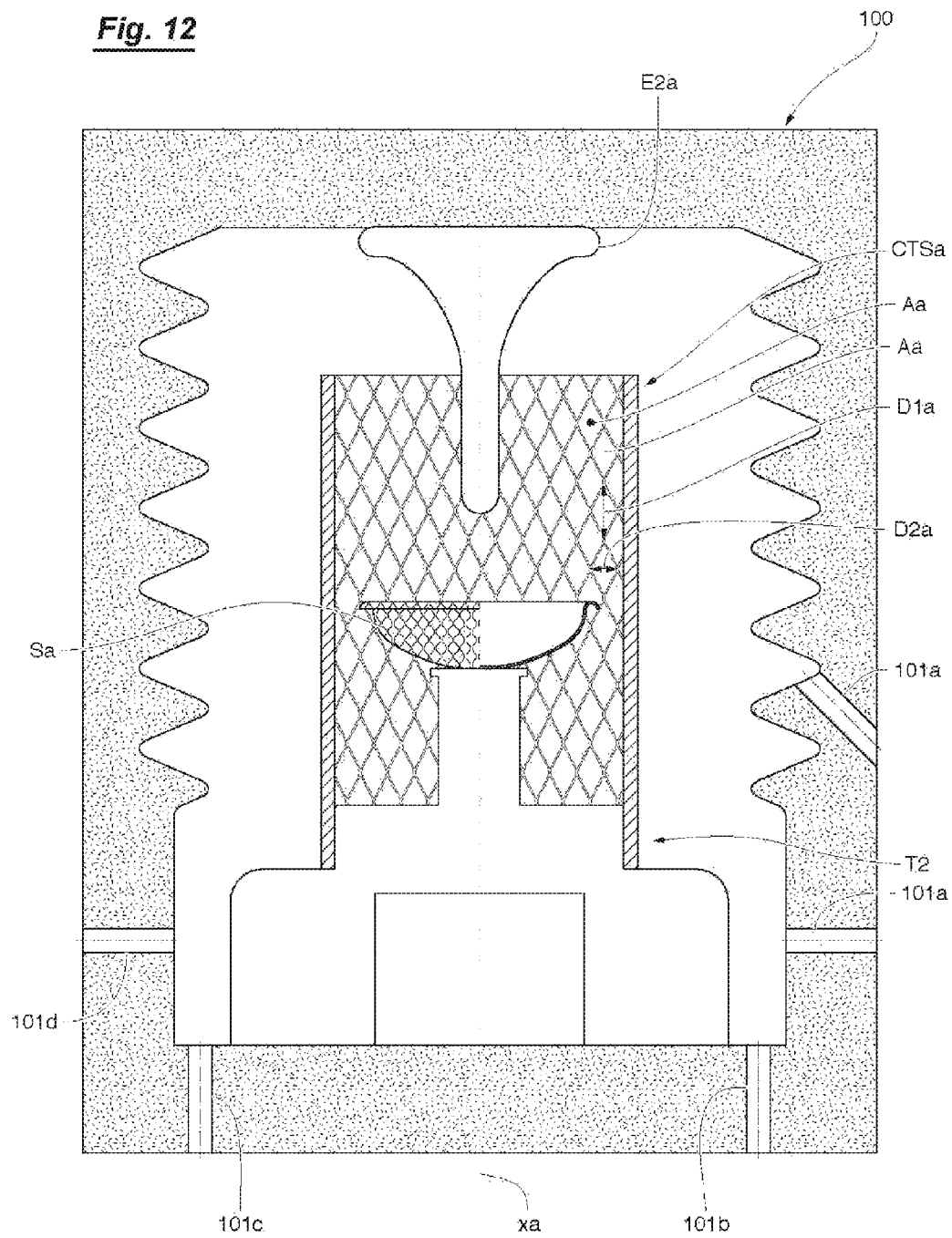
FIG. 12 illustrates a system and a method for manufacturing the capacitive sensor illustrated in FIG. 1A.

FIG. 12 shows a preferred embodiment of a system used to obtain a capacitive sensor to detect an electric field, i.e. a capacitive sensor of the type described above FIG. 1 or 1A.

In this context, the same system can also be used to make in the same way a capacitive sensor for detecting an electric field of the type described above with reference to FIG. 1B.

In this context, in the following description, the references with the postscript letter "a" refer to the capacitive sensor of FIGS. 1 and 1A, while references with the postscript letter "b" refer to the second capacitive sensor of FIG. 1B.

As shown in FIG. 12, and substantially synthetically, the system comprises:

a tubular shielding body CTSa/CTSb that extends axially along its own axis Xa/Xb and has a first head T1a/T1b and a second head T2a/T2b;

an electric field sensor Sa/Sb positioned within said shielding tubular body CTSa/CTSb;

a source electrode E arranged externally with respect to said shielding tubular body and positioned near the first open end, or a source electrode Ea/Eb having a stem and Ea1/Eb1, positioned coaxially into the shielding tubular body CTSa/CTSb;

a mass of dielectric insulating material Mda/MDb positioned inside the shielding tubular body CTSa/CTSb, and around these elements;

a mold 100 comprising one or more pouring ducts 101a, 101b, 101c, and 101d.

The tubular body shielding CTSa/CTSb is formed by a mantle Ma/Mb comprising a plurality of first through-openings Aa/Ab of an elongated shape intended to configure a long dimension D1a/D1b and a small dimension D2a/D2b, the long dimension D1a/D2b of each through-opening Aa/Ab being oriented parallel to the axis Xa/Xb of the shielding tubular body CTSa/CTSb.

The mass of dielectric insulating material MDa/MDb positioned inside the shielding tubular body CTSa/CTSb made from a compound that can take a first liquid/pasty state and a second solid state.

By means of said system, the particular compound in its first liquid/paste state is poured through the ducts 101a, 101b, etc. toward and against the outside mantle Ma/Mb of the shielding tubular body CTSa/CTSb, and said compound in its first liquid/pasty state flows through said plurality of first through openings Aa/Ab into the shielding tubular body CTSa/CTSb.

Still with reference to said system, preferably, said shielding tubular body is positioned and supported in a cantilevered manner within the mold 100 by its head T2a associated with a base Za, where the latter is supported in position by the mold 100.

Still with reference to this system, more preferably, said source electrode Ea is positioned cantilevered within the mold 100 by a head E2a supported in position by the mold 100.

Method to Make a Capacitive Sensor by the System

As in FIG. 12 and the above description regarding the system to get a capacitive sensor, the present invention also concerns a method for obtaining said capacitive sensor, the method being characterized in that it comprises an operative step in which said compound in its first liquid/pasty state flows/passes through said plurality of first through openings Aa/Ab, inside the tubular body shielding CTSa/CTSb to create the formation of the mass of insulating material MDa/MDb within the same shielding tubular body CTSa/CTSb.

By this methodological technical feature, the liquid/pasty compound is positioned within the shielding tubular body CTSa/CTSb without formation of air bubbles and with perfect adhesion between the shielding tubular body CTSa/CTSb and resin MDa/MDb.

Compound for the Formation of the Mass of Insulation Dielectric Material

The mass of dielectric material, MDa/MDb, preferably, comprises an epoxy resin of the insulating dielectric material, or a compound of polyester.

The above description of the capacitive sensor, of the system and of the method to obtain it is provided solely by way of non-limiting example, and therefore, said sensor, said system and said method can be modified or varied in any way suggested by experience and/or its use or application within the scope of the following claims.

The following claims consequently also form an integral part of the above description.

The invention claimed is:

1. A capacitive sensor to sense an electric field, the capacitive sensor comprising:
    a shield tube that extends axially along its own axis and has a first open end;
    an electric field sensor positioned within said shield tube;
    a source electrode; and
    a mass of dielectric insulating material positioned within said shield tube and around said shield tube, the shield tube being formed by a jacket having a plurality of first through openings that each have an area comprised between a minimum of 0.1 mm² and a maximum of 3 mm².

2. The capacitive sensor according to claim 1, wherein the first through openings each have an elongated shape, each through opening has an elongated shape has a long dimension and a short dimension, and
    the long dimension of each through opening is parallel to the axis of the shield tube.

3. The capacitive sensor according to claim 1, wherein said electric field sensor has a plurality of second through openings.

4. The capacitive sensor according to claim 1, wherein said source electrode is outside the shield tube and
    said source electrode is axially spaced from the first open end of said shield tube.

5. The capacitive sensor according to claim 1, wherein the shield tube comprises a first open end and a second opposite closed end;
    the source electrode comprises a shank and a free end;
    the shank extends axially within said shield tube and toward the second opposite closed end of the shield tube;
    the free end is positioned within said shield tube, and
    the free end is axially spaced from the electric field sensor.

6. The capacitive sensor according to claim 5, wherein the electric field sensor has a shape like a cup and/or a spherical dome with an opening facing the source electrode.

7. The capacitive sensor according to claim 1, wherein
    the shield tube comprises a first open end and an opposite second closed end;
    the source electrode comprises a head, a shank and a free end;
    the head is positioned near the first open end of the shield tube and outside the shield tube;
    the shank extends axially within the shield tube and toward the second opposite closed end of the shield tube;
    the free end is inside the shield tube, and
    the free end is axially spaced from the electric field sensor.

8. The capacitive sensor according to claim 1, wherein
    the shield tube comprises a first open end and a second opposite open end;
    the source electrode comprises a shank;
    the shank extends axially within and along said shield tube and
    the electric field sensor is positioned radially spaced from said shank.

9. The capacitive sensor according to claim 1, wherein
    the shield tube comprises a first open end and a second opposite open end;
    the source electrode comprises a first head, a shank, and a second head;
    the first head is positioned near said first open end and externally with respect to the shield tube;
    the second head is positioned near said second opposite open end and externally with respect to the shield tube;
    the shank extends axially within and along said shield tube; and
    the electric field sensor is positioned radially spaced from said shank.

10. The capacitive sensor according to claim 1, wherein said shield tube is formed by a metal sheet having first through openings, and
    the shield tube comprises a first weld bead that extends axially and joins together two axial edges of the sheet to hold same into the shape of a tube.

11. The capacitive sensor according to claim 1, wherein said shield tube is formed by a mesh or grid or cloth,
    the mesh or grid or cloth comprises wires that intersect each other;
    the mesh or grid or cloth has said plurality of first through openings; and
    the wires are made of conductive material.

12. The capacitive sensor according to claim 11, wherein said mesh or grid or cloth comprises a first set of wires and a second set of wires;
    the first set of wires and said second set of wires intersect each other;
    the first set of wires and said second set of wires define a mesh/grid/cloth having through openings;
    the first set of wires and said second set of wires define points of intersection/contact between them;
    the first set of wires and said second set of wires define segments of wire delimited by said points of intersection/contact, and at these points of intersection/contact the respective first wires and the respective second wires are movable relative to each other.

13. A system for making a capacitive sensor to sense an electric field, wherein said system comprises:
- a mold having a plurality of pouring ducts;
- the capacitative sensor comprising:
- a shield tube, in which said shield tube extends axially along its own axis and has a first end and a second end;
- an electric field sensor, in which said electric field sensor is positioned within said shield tube;
- a source electrode, positioned outside with respect to the shield tube and near said first open end, or a source electrode having a shank positioned coaxially inside the shield tube; and
- a mass of dielectric insulating material positioned within said shield tube; wherein:
- the shield tube is formed by a jacket having a plurality of first through openings that each have an elongated shape;
- each through opening having an elongated shape has a long dimension and a short dimension, the long dimension of each through opening being oriented parallel with respect to the axis of the shield tube;
- the mass of dielectric insulating material disposed within the shield tube is made from a compound that can take a first liquid/pasty state and a second solid state, and the compound is flowed in its first liquid/pasty state through the pouring ducts toward and against the outside of the jacket of the shield tube.

14. A method of making a capacitive sensor to sense an electric field, the capacitive sensor comprising:
- a shield tube that extends axially along its own axis and has a first end and a second end;
- an electric field sensor that is positioned within said shield tube;
- a source electrode, arranged outside with respect to the shield tube and near said first open end, or a source electrode having a shank positioned coaxially inside the shield tube; and
- a mass of dielectric insulating material positioned within said shield tube;

the method comprising the steps of:
- forming the shield tube by a jacket having a plurality of first through openings that have an elongated shape with a long dimension and a short dimension, the long dimension of each through opening being parallel with respect to the axis of the shield tube; and
- forming the mass of dielectric insulating material disposed within the shield tube from a compound that can take a first liquid/pasty state and a second solid state by flowing the compound in its first liquid/pasty state through said plurality of first through openings inside the shield tube in order to form the mass of insulating material within the shield tube.

* * * * *